United States Patent [19]

Agostinelli et al.

[11] Patent Number: 5,128,316
[45] Date of Patent: Jul. 7, 1992

[54] ARTICLES CONTAINING A CUBIC PEROVSKITE CRYSTAL STRUCTURE

[75] Inventors: John A. Agostinelli, Rochester; Samuel Chen, Penfield, both of N.Y.

[73] Assignee: Eastman Kodak Company, Rochester, N.Y.

[21] Appl. No.: 532,479

[22] Filed: Jun. 4, 1990

[51] Int. Cl.$^5$ .............................................. B32B 9/00
[52] U.S. Cl. ......................................... 505/1; 505/701; 505/702; 505/703; 505/704; 428/426; 428/433; 428/688; 428/700; 428/901; 428/930
[58] Field of Search ................... 505/1, 701, 702, 703, 505/704; 428/426, 433, 688, 700, 901, 930

[56] References Cited

U.S. PATENT DOCUMENTS 4,880,770 11/1989 Mir et al. ................................. 505/1
4,908,346 3/1990 Strom et al. ............................ 505/1

OTHER PUBLICATIONS

Dijkkamp et al., "Preparation of Y-Ba-Cu Oxide Superconductor Thin Films Using Pulsed Laser Evaporation from High Tc Bulk Material", App. Phys. Lett., 51 (8), Aug. 24, 1987, pp. 619-621.
Wu et al., "Superlattices of Y-Ba-Cu-O/$Y_y$-Pr$_{1-y}$-Ba-Cu-O Grown by Pulsed Laser Deposition", Appl. Phys. Lett., 56 (4), Jan. 22, 1990, pp. 400-402.
Rogers et al., "Fabrication of Heteroepitaxial YBa$_2$Cu$_3$O$_{7-x}$-PrYBa$_2$Cu$_3$O$_{7-x}$ Josephson Devices Grown by Laser Deposition", Appl. Phys. Lett., 55 (19), Nov. 2, 1989, pp. 2032-2034.
J. Geerk, G. Linker and O. Meyer, "Epitaxial Growth and Properties of YBaCuO Thin Films", *Materials Science Reports*, vol. 4, No. 5, 6, pp. 193-260, Nov. 1989, [MSREEL 4(5,6) 193-260 (1989)].

*Primary Examiner*—Patrick J. Ryan
*Attorney, Agent, or Firm*—Carl O. Thomas

[57] ABSTRACT

A cubic perovskite crystal structure is disclosed satisfying the unit cell formula:

$$R_{0.33+z}A_{0.67}C_{1-y}O_{3-x}$$

where
R, A and C represent rare earth, alkaline earth and copper atoms, respectively, capable of forming a superconductive $R_1A_2C_3$ orthorhombic perovskite crystal structure;
x is 0.67 to 1.0;
y is up to 0.2; and
z is up to 0.1.

The crystal structure can be used to form superconductive superlattices and weak links for Josephson junction devices. The crystal structure can be produced by laser ablation deposition at a temperature below that required for the formation of a superconductive $R_1A_2C_3$ orthorhombic perovskite crystal structure. The crystal structure can be used as a substrate for the subsequent deposition of an $R_1A_2C_3$ orthorhombic perovskite crystal structure.

16 Claims, 1 Drawing Sheet

ARTICLES CONTAINING A CUBIC PEROVSKITE CRYSTAL STRUCTURE

FIELD OF THE INVENTION

The invention relates to a novel crystal structure, a process for its preparation, and articles constructed from the crystal structure, particularly superconducting articles, such as superlattices and Josephson junction devices.

BACKGROUND

A distinct class of high temperature ($T_o > 30°$ K.) superconductive materials are those rare earth (R) alkaline earth (A) copper (C) oxides that exhibit an $R_1A_2C_3$ orthorhombic perovskite crystal structure, hereinafter also referred to as high $T_o$ $R_1A_2C_3$ crystal structures.

Figure 1:
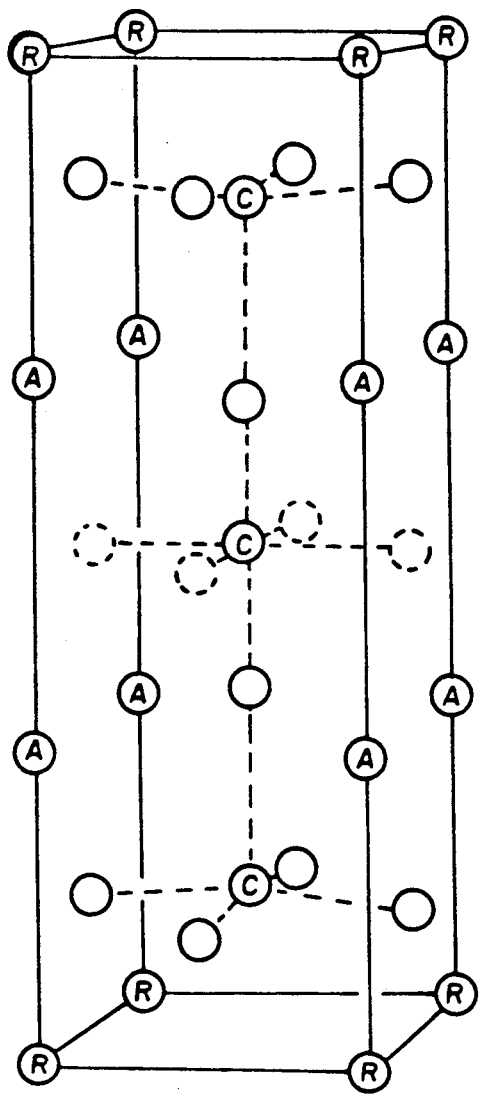
FIG. 1 is a diagram of an $R_1A_2C_3$ orthorhombic perovskite crystal structure unit cell.

The unit cell of a superconductive $R_1A_2C_3$ orthorhombic perovskite crystal structure is commonly accepted to exhibit the form shown in FIG. 1, where R represents rare earth atoms, A represents alkaline earth atoms, C represents copper atoms, the unlabeled solid circles represent oxygen atoms, and the unlabeled dashed circles represent oxygen atom sites some of which are vacant. The dashed lines connecting the oxygen and copper atoms schematically represent the oxygen to copper linkages generally believed to provide the conduction paths through the unit cell. The solid lines indicate the boundaries of the unit cell. While a total of eight rare earth atoms are shown, each of these atoms is shared by eight adjacent unit cells (only one of which is shown), so that there is only one rare earth atom per unit cell. Similarly, while a total of eight alkaline earth atoms are shown, each of these atoms is shared by four adjacent unit cells (only one of which is shown), so that there are therefore only two alkaline earth atoms per unit cell. While there are only three copper atoms shown, each atom lies entirely within the unit cell, so that there are three copper atoms per unit cell. Fourteen oxygen atom sites are shown, two contained entirely within the unit cell and 12 each shared by one adjacent unit cell (not shown). If all possible oxygen sites were occupied, there would be a total of eight oxygen atoms present per unit cell. A superconductive unit cell contains between 6.4 and 7 oxygen atoms. A variety of notations, such as $O_{9-x}$, $O_{8-x}$, $O_{7-x}$, $O_{6+x}$ and the like have been employed to indicate fractional oxygen inclusions.

In references to an $R_1A_2C_3$ orthorhombic perovskite crystal structure, oxygen is always present and therefore, in keeping with common usage in the art, is elided from the notation in the interest of brevity. The unit cell of the $R_1A_2C_3$ orthorhombic perovskite crystal phase exhibits three mutually perpendicular axes, where the minor axes, the a-axis and the b-axis, are of nearly equal length. The rare earth atoms lie in unit cell basal planes defined by the a- and b-axes. The unit cell major axis, the c-axis, is oriented normal to the basal planes. In superconductive layers coated on substrates the c-axis is typically oriented perpendicular to the substrate.

PRIOR ART

PA-1—Mir et al U.S. Pat. No. 4,880,770 discloses thin ($<5$ $\mu$m in thickness) superconductive $R_1A_2C_3$ layers and processes for their preparation by spin coating metal-ligand precursor compounds following by thermal decomposition.

PA-2—Strom U.S. Pat. No. 4,908,346 discloses thick ($>5$ $\mu$m in thickness) superconductive $R_1A_2C_3$ layers and processes for their preparation relying on the spray evaporation of dissolved metal-ligand precursor compounds followed by thermal decomposition.

PA-3—Dijkkamp et al "Preparation of Y-Ba-Cu Oxide Superconductor Thin Films Using Pulsed Laser Evaporation From High $T_c$ Bulk Material", Appl. Phys. Lett. 51 (8), 24 Aug. 1987, pp. 619–621, reports the preparation of superconductive $Y_1Ba_2Cu_3O_{8-x}$ thin films by pulsed excimer laser evaporation of bulk material and deposition onto a heated substrate of strontium titanate or alumina. The process described is commonly referred to as laser ablation deposition.

PA-4—Wu et al "Superlattices of Y-Ba-Cu-O/$Y_y$Pr$_{1-y}$-Ba-Cu-O Grown by Pulsed Laser Deposition", Appl. Phys. Lett. 56 (4), 22 Jan. 1990, pp. 400–402, reports the formation of a superlattice consisting of superconductive layers of $Y_1Ba_2Cu_3O_{7-}$ semiconductive layers of $Y_yPr_{1-y}Ba_2CuO_{7-x}$. The laser ablation process described in PA-3 was modified to provide two different bulk target materials that were sequentially addressed by the laser.

PA-5—Rogers et al "Fabrication of Heteroepitaxial $YBa_2Cu_3O_{7-x}$-$PrYBa_2Cu_3O_{7-x}$-$YBa_2Cu_3O_{7-x}$ Josephson Devices Grown by Laser Deposition, Appl. Phys. Lett. 55 (19), 2 Nov. 1989, pp. 2032–2034, reports the preparation of Josephson junction devices by laser ablation deposition techniques similar to those PA-3 and PA-4.

SUMMARY OF THE INVENTION

The present invention represents an advance in the state of the art in providing a novel crystal structure. More particularly, this invention provides a novel crystal structure that can contain the same elements contained in $R_1A_2C_3$ orthorhombic perovskite crystal structures, such as those known to exhibit high temperature superconductivity. The novel crystal structure has utility in forming superlattices and weak links in Josephson junction devices.

A specific advantage of the present invention is that the novel crystal structure is highly compatible with $R_1A_2C_3$ orthorhombic perovskite crystal structures. The unit cell axes of the novel crystal structure closely match the unit cell minor axes of corresponding $R_1A_2C_3$ orthorhombic perovskite crystal structures. This facilitates both epitaxial deposition of the novel crystal structure onto a $R_1A_2C_3$ orthorhombic perovskite crystal structure and the use of the novel crystal structure as a substrate for the epitaxial deposition of an $R_1A_2C_3$ orthorhombic perovskite crystal structure.

The novel crystal structures of this invention offer distinct advantages when employed in combination with $R_1A_2C_3$ orthorhombic perovskite crystal structures which exhibit high temperature superconductivity. Since the novel crystal structures can employ the same elements in similar proportions to those found in high $T_o$ $R_1A_2C_3$ crystal structures, the risk of degrading the conductive properties of adjacent $R_1A_2C_3$ crystal structures during high temperature processing is avoided. By comparison, when a semiconducting praseodymium $R_1A_2C_3$ orthorhombic perovskite crystal structure is employed in combination with a high $T_o$ $R_1A_2C_3$ crystal structure, there is a distinct risk of praseodymium migration into the adjacent superconductor during high temperature processing steps, degrading the conductivity characteristics of the adjacent superconductive crystal structure.

The present invention offers additional advantages over praseodymium containing layers used in combination with high $T_o$ $R_1A_2C_3$ crystal structures. It is possible in the practice of this invention to form superlattices and Josephson junction devices containing superconductive $R_1A_2C_3$ orthorhombic pervoskite crystal structures using a single source material for deposition. Specifically, it is possible to use any rare earth alkaline earth copper oxide having the rare earth, alkaline earth and copper stiochiometry of a superconductive $R_1A_2C_3$ orthorhombic perovskite crystal structure as a source for producing both the superconductive $R_1A_2C_3$ orthorhombic pervoskite crystal structure layers and the layers containing the novel crystal structure of this invention.

The present invention has arisen from the discovery that by varying the temperature of a heating stage for a substrate used in a laser ablation deposition process for the formation of an $R_1A_2C_3$ orthorhombic perovskite crystalline layer (e.g., any one of the processes disclosed by PA-3, PA-4 or PA-5, cited above) a novel cubic perovskite crystal structure can be formed.

A second and at least equally important discovery is that once formed the novel cubic perovskite crystal structure layers remain stable when heated to temperatures sufficient to permit the formation of $R_1A_2C_3$ orthorhombic perovskite crystal structures. This permits cubic perovskite crystal structure layers to serve as substrates for the deposition $R_1A_2C_3$ orthorhombic perovskite crystal structure layers and this in turn allows the formation of superlattices and Josephson junction devices.

In one aspect, this invention is directed to a cubic perovskite crystal structure satisfying the unit cell formula:

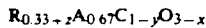

where
R, A and C represent rare earth, alkaline earth and copper atoms, respectively, capable of forming a superconductive $R_1A_2C_3$ crystal structure;
x is 0.67 to 1;
y is up to 0.2; and
z is up to 0.1.

In another aspect, this invention is directed to an article comprised of a substrate capable of supporting the epitaxial deposition of an $R_1A_2C_3$ orthorhombic perovskite crystal phase and a layer comprised of a cubic perovskite crystal structure according this invention.

In an additional aspect, this invention is directed to a Josephson junction device comprised of at least first and second superconductive layers conductively joined by a lower conductivity weak link, characterized in that the weak link is comprised of a cubic perovskite crystal structure according to this invention.

In yet another aspect, this invention is directed to a superlattice consisting essentially of a plurality of superconductive layers exhibiting an $R_1A_2C_3$ orthorhombic perovskite crystal structure with the major faces of the layers being oriented perpendicular to the crystal unit cell c-axis of the layers and interposed between adjacent pairs of said layers a layer exhibiting a cubic perovskite crystal structure according to this invention.

In a further aspect, this invention is directed to a process of forming a rare earth alkaline earth copper oxide crystal structure by laser ablation deposition comprising (a) addressing a body of a rare earth alkaline earth copper oxide exhibiting the rare earth, alkaline earth and copper stoichiometry of a superconductive $R_1A_2C_3$ orthorhombic perovskite crystal structure with a laser to ablate a portion of the rare earth alkaline earth copper oxide and (b) condensing the ablated rare earth, alkaline earth and copper with oxygen on a substrate mounted on a heating stage. The process is characterized in that the temperature of the heating stage is maintained in a range sufficient to allow crystal formation, but below the minimum temperature required for formation of the $R_1A_2C_3$ orthorhombic perovskite crystal structure, so that a cubic perovskite crystal structure is produced.

DESCRIPTION OF PREFERRED EMBODIMENTS

Figure 2:
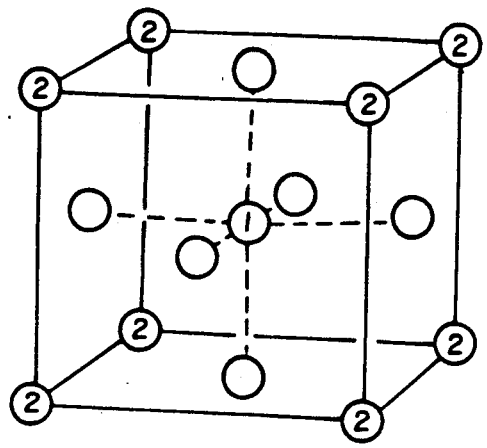
FIG. 2 is a diagram of a cubic perovskite crystal structure unit cell.

A cubic perovskite crystal structure unit cell is shown in FIG. 2. Being cubic, the unit cell exhibits indistinguishable mutually perpendicular a-, b- and c-axes. A first metal atom site labeled 1 lies at the center of the cubic unit cell. Eight second metal atom sites labeled 2 lie at the corners of the unit cell. Each of the atoms at the second metal atom sites are shared by eight adjacent unit cells (only one of which is shown), so that the second metal atom sites collectively contribute only one metal atom per unit cell. The unlabeled circles represent six oxygen atom sites that occupy a face-centered location in each of the six faces of the unit cell and are each shared with an adjacent unit cell (not shown). When all possible oxygen atom site locations are occupied, there are a total of three oxygen atoms per unit cell.

The cubic perovskite crystal structures of this invention satisfy the unit cell formula:

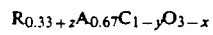

where
R, A and C represent rare earth, alkaline earth and copper atoms, respectively, capable of forming a superconductive $R_1A_2C_3$ orthorhombic pervoskite crystal structure;
x is 0.67 to 1;
y is up to 0.2; and
z is up to 0.1.

When comparing the cubic perovskite unit cell structure to that of a superconductive $R_1A_2C_3$ orthorhombic perovskite crystal structure unit cell, certain similarities and differences are apparent. One of the most important similarities is that the cubic perovskite unit cell exhibits dimensions that are similar to the minor axes dimensions of an $R_1A_2C_3$ orthorhombic perovskite unit cell formed of the same elements. Similarities in both unit cell facial configuration and dimensions facilitate epitaxial deposition of either crystal structure on the other.

The cubic perovskite unit cell structure can contain oxygen in the same proportions found a corresponding $R_1A_2C_3$ orthorhombic perovskite crystal structure. In a preferred form of the invention x is in the range of from 0.67 to 0.85.

The orthorhombic perovskite unit cell structure 1:2:3 atomic ratio of rare earth:alkaline earth:copper can be present in the cubic perovskite unit cell structure. However, in preferred cubic pervoskite crystal structures there is a slight copper deficiency. That is, y is preferably in the range of from 0.05 to 0.18. A slight excess of rare earth can also be present in the preferred crystal structures. In preferred cubic perovskite crystal structures z ranges from zero to 0.08. Since there are only center and corner metal atom sites available in the cubic perovskite unit cell structure and the ratio of the rare earth to alkaline earth atoms is approximately 1:2, there is no possibility of the type of ordered arrangement of rare earth and alkaline earth atoms found the orthorhombic perovskite unit cell structure. The relatively low temperatures at which the cubic perovskite crystal structure is formed as compared to the $R_1A_2C_3$ orthorhombic perovskite crystal structure accounts for the differences in their unit cell structure. It is believed that the higher temperatures employed in forming the $R_1A_2C_3$ orthorhombic perovskite crystal structure provides enough additional energy to facilitate formation of the more ordered relationship of metal atoms found in the unit cells of these crystal structures. Since the present invention does not require the cubic perovskite crystal structure to exhibit superconductivity and superconductivity, if present, advantageously occurs well below those of high $T_o$ $R_1A_2C_3$ for superlattices and Josephson junction applications, the variance of rare earth, alkaline earth and copper atoms from 1:2:3 stoichiometry is not objectionable nor critical to the utility of cubic perovskite crystal structures satisfying the requirements of this invention.

Any combination of rare earth, alkaline earth and copper elements known to be capable of forming a superconductive $R_1A_2C_3$ orthorhombic perovskite crystal structure is contemplated for inclusion in the cubic perovskite crystal structures of this invention. The term "rare earth" is used to indicate group 3, periods 4, 5 and 6 elements. Scandium, yttrium and the lanthanides, other than cerium, praseodymium, promethium and terbium (i.e., the lanthanides neodymium, samarium, europium, gadolinium, dysprosium, holmium, erbium, thulium, ytterbium and lutetium), employed singly or in combination, are known to produce superconductive $R_1A_2C_3$ orthorhombic perovskite crystal structures. Yttrium and the above-identified lanthanides constitute specifically preferred rare earths. The alkaline earth elements are preferably at least 50 percent barium on an atomic basis with any additional alkaline earths being chosen from the group consisting of strontium and calcium, most preferably at least 80 percent barium on an atomic basis with the additional alkaline earth element, when present, being strontium.

A specifically preferred cubic perovskite crystal structure satisfies the unit cell formula:

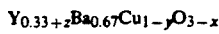

$$Y_{0.33+z}Ba_{0.67}Cu_{1-y}O_{3-x}$$

where
  x represents 0.67 to 0.85;
  y represents 0.05 to 0.18; and
  z represents up to 0.08.

This unit cell formula is highly compatible with high $T_o$ $Y_1Ba_2Cu_3$ crystal structures.

The novel cubic perovskite crystal structures of this invention can be produced by varying the conditions employed for forming $R_1A_2C_3$ orthorhombic perovskite crystal structures by the laser ablation deposition process. For example, novel cubic perovskite crystal structures can be produced by varying temperatures employed in the laser ablation deposition processes disclosed by references PA-3, PA-4 and PA-5, cited above and here incorporated by reference. In the laser ablation deposition process any rare earth alkaline earth copper oxide having the rare earth, alkaline earth and copper stoichiometry of a superconductive $R_1A_2C_3$ orthorhombic perovskite crystal structure can be used as a source material. The source material can be either crystalline or amorphous. The source material is placed in an evacuated chamber adjacent a heated stage on which is mounted a substrate. The substrate is mounted in thermally conductive contact with the heated stage. The accepted and most replicable practice (here adopted) is to monitor and regulate the temperature of the heated stage. A series of laser pulses aimed at the source material is responsible for transfer of material from the bulk source to the substrate. During ablation a plasma is created containing a mixture of rare earth, alkaline earth and copper elements and ions. These elements interacting with oxygen condense on the substrate to reform a rare earth alkaline earth copper oxide. In addition to its simplicity, the process has the advantage that high vacuum conditions are not required, although they can be employed. For example, ambient pressures ranging from $10^{-4}$ to 300 mTorr. have been reported.

It has been discovered that by maintaining the temperature of the heated stage below (but typically within about 120° C. of) the temperature required to produce an $R_1A_2C_3$ orthorhombic perovskite crystal structure a coating of a cubic perovskite crystal structure is formed on deposition. A preferred temperature range for formation of the cubic perovskite crystal structure is in the range of from about 530° to 640° C. For yttrium barium copper oxide deposition in a cubic perovskite crystal structure an optimum temperature range is from 540° to 630° C.

As discussed above, one possible explanation for the formation of the cubic perovskite crystal structure is that there is enough thermal energy present to support the ordering of atoms as described in connection with FIG. 2, but insufficient thermal energy to allow a further transition to occur to the relative ordering of rare earth and alkaline earth elements as shown in FIG. 1. For example, when the heated stage is maintained at 525° C. or less an amorphous deposit of yttrium barium copper oxide is observed. On the other hand, when the heated stage is maintained at a temperature of 650° C. or higher, a $Y_1Ba_2Cu_3$ orthorhombic perovskite crystal structure is formed.

The substrate used to receive the cubic perovskite crystal structure can take any form known to be capable of serving as a substrate for a corresponding $R_1A_2C_3$ orthorhombic perovskite crystal structure. In addition, an $R_1A_2C_3$ orthorhombic perovskite crystal structure (typically itself a layer on a substrate) is specifically contemplated as a substrate for the cubic perovskite crystal structure. Thus, any of the substrates disclosed to permit the formation of $R_1A_2C_3$ orthorhombic perovskite crystal structures in references PA-1, PA-2, PA-3, PA-4 and PA-5, cited above and here incorporated by reference, can be employed. Highly compatible substrates are materials that themselves exhibit a perovskite or perovskite-like crystal structure. Strontium titanate is an example of a perovskite crystal structure which is specifically preferred for use as a substrate. Lanthanum aluminate (LaAlO$_3$), lanthanum gallium oxide (LaGaO$_3$) and potassium tantalate are other examples of useful perovskites. Other preferred substrates which are not perovskites include magnesia and alumina, particularly in their monocrystalline forms.

Composite substrates are specifically contemplated. Composite substrates typically consist of at least one material chosen for reasons other than its compatibility with forming crystalline rare earth alkaline earth copper oxides and one or more barrier layers that serve the function of providing a compatible deposition surface for a crystalline rare earth alkaline cooper oxide layer.

The simplest approach to forming a barrier layer is simply to form successive layers of rare earth alkaline earth copper oxide until a deposition surface has been created that is capable of minimizing any deleterious effect on the next deposited layer by the underlying substrate portion. In the practice of the present invention it has been observed in some instances that even when a support such as magnesia, which is known to be highly compatible with forming an $R_1A_2C_3$ orthorhombic pervoskite crystal structure, a layer having a thickness which is a few multiples of the unit cell dimensions is first formed as an $R_1A_2C_3$ orthorhombic pervoskite crystal structure before the desired cubic perovskite crystal structure is observed. Therefore, in one preferred form of the invention the composite substrate includes a layer of an $R_1A_2C_3$ orthorhombic pervoskite crystal structure that is at least about 50 Å in thickness. To assure that the $R_1A_2C_3$ orthorhombic pervoskite crystal structure substrate layer contains minimal defects, it is preferred that the this layer have a thickness of at least about 500 Å, optimally at least 0.1 μm. The maximum thickness of the $R_1A_2C_3$ orthorhombic pervoskite crystal structure substrate layer is entirely a matter choice, since the entire substrate can be formed of the $R_1A_2C_3$ orthorhombic pervoskite crystal structure, if desired. When the $R_1A_2C_3$ orthorhombic pervoskite crystal structure layer is formed by laser ablation deposition, it is preferably less than 1 μm in thickness. Other techniques, such as the thick film formation procedures of PA-2, here incorporated by reference, can be used to form $R_1A_2C_3$ orthorhombic pervoskite thick (>5 μm) films.

When silicon is a substrate material, a specifically preferred barrier layer system consisting of zirconium, silicon and oxygen in combination is that disclosed by Hung et al U.S. Pat. No. 4,908,348, here incorporated by reference. Metals of groups 8 to 11 and periods 5 and 6 of the periodic table of elements (as adopted by the American Chemical Society) are well suited to forming deposition surfaces for the deposition of the rare earth alkaline earth copper oxides and also have the capability of acting as release layers, allowing the supported rare earth alkaline earth copper oxide layer or layers to be transferred to another support, such as a flexible organic film support, after formation of the crystalline rare earth alkaline earth oxide layer or layers at elevated temperatures is completed. Further details are provided by Mir et al U.S. Ser. No. 308,297, filed Feb. 9, 1989 and commonly assigned, now U.S. Pat. No. 4,988,677. Useful rare earth alkaline earth copper oxide layers can be formed on supports which are austenitic alloys of chromium and one or both of iron and nickel when a high density (at least 90 percent of theoretical density) hafnia barrier layer is employed. Zirconia can be substituted for hafnia, but with auxiliary barrier materials, such as hafnia, magnesia, strontium titanate, lanthanum aluminate, lanthanum gallium oxide and potassium tantalate, being contemplated to fill fissures in the zirconia barrier layer. Hung et al U.S. Ser. Nos. 475,527 and 475,528, filed Feb. 6, 1990 and commonly assigned, disclose further details.

Once a cubic perovskite crystal structure has been formed on a substrate, it is capable of withstanding temperatures well in excess of the maximum temperature at which it can be formed without conversion to an $R_1A_2C_3$ orthorhombic perovskite crystal structure. A cubic pervoskite yttrium barium copper oxide was converted to an orthorhombic perovskite crystal structure by annealing in air at 950° C.

Notice that conversion occurred at 300° C. above the 650° C. heated stage temperature required to form an $R_1A_2C_3$ orthorhombic perovskite by laser ablation deposition. Thus, a wide range of temperatures are available for forming $R_1A_2C_3$ orthorhombic perovskite crystal structures on cubic perovskite crystal structure surfaces without degradation of the latter. Deposition of $R_1A_2C_3$ orthorhombic perovskite crystal structures onto cubic perovskite crystal structure surfaces are contemplated at heated stage temperatures of up to 900° C. or higher. Deposition is preferred at the lowest convenient heated stage temperature, preferably 650° to 850° C., optimally 700° to 750° C.

It is known in the art that each of a potential bias and the presence of a continuous oxygen plasma allow orthorhombic perovskite crystal structures to be obtained by laser ablation deposition at temperatures well below (e.g. approximately 100° C. below) those indicated above. These same modification of laser ablation conditions are contemplated to allow similar lowering of temperatures required to form the cubic perovskite crystal structure of this invention.

The observed stability of the cubic perovskite crystal structure at temperatures above its formation temperature and within workable temperature ranges for providing $R_1A_2C_3$ orthorhombic perovskite crystal structures, particularly those that exhibit high temperature superconductivity, results in a variety of utilities that would not otherwise be possible.

Figure 3:
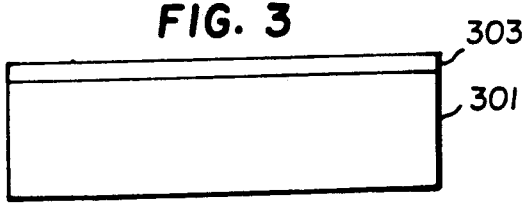
FIGS. 3 to 6 inclusive are schematic illustrations of articles according to the invention.

One of the utilities which a novel cubic perovskite crystal structure according to the invention can serve is as a substrate barrier layer for the deposition of a high $T_o R_1A_2C_3$ crystal structure. A simple article capable of serving this utility is shown in FIG. 3, where 301 represents any simple or composite substrate disclosed above capable of supporting the deposition of a novel cubic perovskite crystal structure according to the invention and 303 represents a thin (>5 μm) film of the cubic perovskite crystal structure. The thin film preferably exhibits a minimum thickness of at least 50 Å, preferably at least 500 Å, and optimally at least about 0.1 μm. Since the cubic perovskite crystal structure layer 303 is formed at a lower temperature than that required to form a high $T_o R_1A_2C_3$ crystal structure, there is less opportunity for deleterious substrate components to migrate within the layer 303 as it is being formed than would be the case if an attempt were made to deposit a high $T_o R_1A_2C_3$ crystal structure directly on the substrate. When higher temperatures are subsequently encountered in form a high $T_o R_1A_2C_3$ crystal structure layer on the layer 303, the latter acts as a diffusion barrier.

Figure 4:
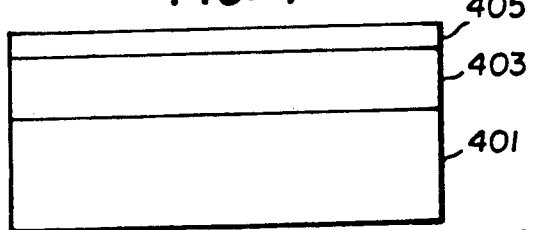

Another form of the invention is shown in FIG. 4, wherein a substrate 401 is shown with an $R_1A_2C_3$ orthrhombic perovskite crystal structure layer 403 deposited thereon which in turn supports a novel cubic perovskite crystal structure layer 405 satisfying the requirements of the invention. This arrangement can be substituted for that of FIG. 3. In this instance the layers 403 and 405 both serve as barrier layers. This arrangement has the further advantage that the substrate 401 need not be capable of allowing a cubic perovskite crystal structure to form directly on its surface.

When the substrate 401 and $R_1A_2C_3$ orthorhombic perovskite crystal structure layer 403 are sufficiently compatible to allow layer 403 to be a high $T_o$ superconductor, the arrangement of FIG. 4 represents an initial building block for the devices of the invention described below.

In considering the FIG. 3 and 4 structures it is important to note that the similarities of the $R_1A_2C_3$ orthorhombic perovskite crystal structure layer and the cubic perovskite crystal structure layer allow either to serve as a substrate for the epitaxial deposition of the other.

Figure 5:
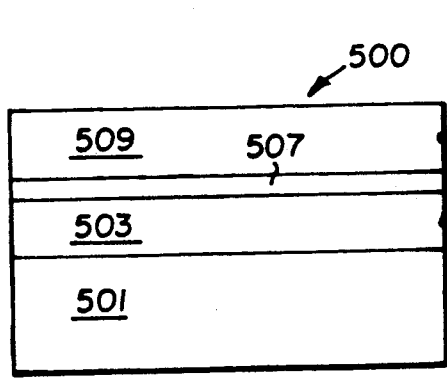

A preferred structure containing a cubic perovskite crystal structure satisfying the requirements of the invention is a Josephson junction device. A Josephson junction device 500 is shown in FIG. 5. As shown, the device consists of a substrate 501, which can take any of the various forms described above. Located on the substrate is a first high temperature superconductive layer 503 containing an $R_1A_2C_3$ crystal structure. A lead 505 schematically indicating an external electrical connection is shown attached to the first superconductive layer. Overlying the first superconductive layer is a layer 507 forming a weak link—i.e., a layer of relatively less conductive material through which carriers flow. The Josephson junction devices of this invention are characterized in that the weak link is a cubic perovskite crystal structure layer of the type discussed above. Overlying the weak link is a second high temperature superconductive layer 509 containing an $R_1A_2C_3$ orthorhombic perovskite crystal structure. A second lead 511 permits external electrical connection to the second superconductive layer.

While Josephson junction devices have been reported with weak links having thicknesses up to about 500 Å, it is generally preferred to construct the weak links with layer thicknesses of less than 100 Å. The thicknesses of the adjacent superconductive layers are not critical to the operation of the device and can be of any convenient thickness, typically ranging from about 500 Å to 10 μm.

Josephson junction devices offer the capability of acting as extremely high frequency switches. Josephson junction devices are generally recognized to be useful for constructing superconducting quantum interference (SQUID) devices for sensitive magnetic field detection and for use as nonlinear electronic components in addition to their fast switching utility.

Epitaxial semiconductor superlattice structures of group 14 elements (e.g., silicon and germanium) and compounds of groups 13 and 15 (e.g., gallium arsenide, gallium aluminum arsenide) has led to host of useful structures ranging from lasers to detectors. It has been speculated that if superlattices were available in high temperature superconducting crystal structures the superlattice capability could also be used to construct useful devices.

The present invention offers the capability of constructing superlattices, particularly superlattices containing superconducting and optimally high temperature superconducting layers. This is possible by interrupting the deposition of $R_1A_2C_3$ orthorhombic perovskite crystal structures to interpose one or more cubic perovskite crystal structures at selected intervals.

Figure 6:
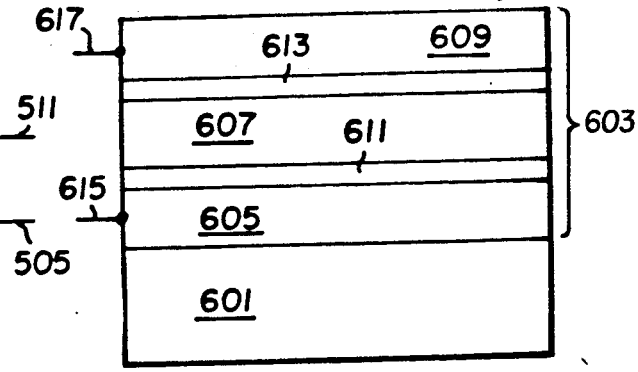

A useful application of a superlattice structure satisfying the requirements of this invention is shown in FIG. 6. The substrate 601 can take any of the various forms described above. On the substrate is located a superlattice 603 consisting of a plurality $R_1A_2C_3$ orthorhombic perovskite crystal structure layers shown for simplicity as three such layers 605, 607 and 609 each adjacent pair of which is separated by a cubic perovskite crystal structure layer shown as layers 611 and 613. In a specifically preferred form the $R_1A_2C_3$ orthorhombic perovskite crystal structure layers each exhibit high temperature superconductivity.

When the cubic perovskite crystal structure layers are similar to layer 507 and electrical leads schematically shown at 615 and 617 are attached to the endmost $R_1A_2C_3$ crystal structure layers, the superlattice can take the form of device 600 comprised of a series of integrated Josephson junction devices. The layers 605, 611 and 607 form one Josephson junction functional unit while layers 607, 613 and 609 form a second Josephson junction functional unit. Device 600 can be used as a series switch, offering an increased level reliability as compared to single functional unit switch.

Specifically contemplated superlattices contemplated include periodic superlattices. The term "periodic superlattice" refers to an identically repeated sequence—e.g., an orthorhombic perovskite layer and a cubic perovskite layer that form a unit of the superlattice that is identically repeated one or, more typically, many times. Symmetric periodic superlattices are specifically contemplated. A symmetric periodic superlattice is one in which the layers of the identically repeated unit are of equal thickness—e.g., a periodic superlattice in which the identically repeated unit consists of a cubic perovskite crystal structure layer and an orthorhombic perovskite crystal structure layer of the same thickness.

EXAMPLES

The construction and characterization of the invention can be more fully appreciated by reference to the following specific examples. The acronyms "XRD" and "TEM" stand for X-ray diffraction and transmission electron microscopy, respectively.

EXAMPLE 1

Cubic Perovskite Crystal Structure Thin Film on MgO

The title film was deposited on a {100} crystal face of a monocrystalline magnesia (MgO) substrate by laser ablation deposition.

The target material was a 2.54 cm diameter disk of bulk polycrystalline $YBa_2Cu_3O_{7-x}$ high temperature superconductor material. The target was mounted on a rotating stage and positioned in a vacuum chamber. During deposition the target rotation rate was 6 rpm.

The monocrystalline MgO substrate was 2.5×1.3 cm and was located on a resistively heated stage 5 cm from the target. The MgO substrate was mounted on the heated stage using spring clips and a silver paint thermal transfer layer between the heated stage and the substrate to facilitate efficient heat transfer. The substrate was preheated on the stage prior to deposition both to pyrolyze the paint vehicle and to clean the substrate surface of any organic residues. During this step the substrate heater block was raised to 700° C. and held at that temperature for 5 minutes.

The chamber was then pumped to a pressure of $5 \times 10^{-4}$ Torr and then backfilled while pumping with oxygen to a pressure of 200 mTorr measured 20 cm away from the target. The oxygen was introduced via a tube which directed the gas toward the substrate surface. The oxygen flow rate was controlled at 20 sccm.

A 248 nm laser beam from a Lambda Physik 210i TM (KrF) excimer laser was directed on the target via a highly reflective mirror, a 500 mm high purity fused quartz lens and vacuum chamber window of a similar quartz material. The laser was operated at a repetition rate of 2 Hz with a pulse duration of about 20 ns and a pulse energy of 400 mJ. The beam spot size on target measured about $2.5 \times 8$ mm, giving a fluence near 2 $J/cm^2$.

A shutter interposed between the target and substrate was closed to permit the target to be laser addressed without depositing material on the substrate. The laser was fired for 150 pulses immediately before opening the shutter to insure that the highest possible purity of material was made available from the target.

With the shutter opened, a total of 3000 laser pulses were used to grow the film on the substrate. During deposition the heated substrate stage was maintained at 560° C. After the 3000 laser pulses the oxygen pressure in the chamber was raised to about 170 Torr. The sample was maintained in this environment for 15 minutes, after which heating of the substrate stage was discontinued. The sample was allowed to cool to room temperature and then removed.

The deposited film was found to have a shiny black appearance. Room temperature four point probe resistivity measurements gave a sheet resistance of about 100 ohms per square. The film thickness was found to be approximately 3000 Angstroms by profilometry. XRD showed the film to be a highly ordered cubic crystal structure presenting a {100} crystallographic surface. XRD and TEM analyses of this and similarly prepared samples analysis also indicated a very thin interfacial $R_1A_2C_3$ orthorhombic perovskite crystal structure, indicating that the first few unit cell lattice planes exhibited the $R_1A_2C_3$ orthorhombic perovskite crystal structure before formation of the cubic perovskite crystal structure began.

EXAMPLE 2

Cubic Perovskite Crystal Structure Thin Film on $SrTiO_3$

A thin film was prepared similarly as described in Example 1, except that a monocrystalline $SrTiO_3$ substrate was substituted for the MgO substrate. Deposition was undertaken onto a {100} crystal face.

The cubic perovskite crystal structure thin film produced was similar to that observed in Example 1, but with the difference that no orthorhombic perovskite crystal structure was detected by XRD analysis. Ion channeling measurements indicated a significant degree of crystalline perfection, with an aligned minimum backscatter yield of 71%.

EXAMPLE 3

The Effect of Temperature on Obtaining Orthorhombic or Cubic Perovskite Crystal Structure Thin Films on MgO Except as otherwise noted, the procedure employed was similar to that of Example 1. The heated substrate stage temperature was held at 700° C. during deposition. A total of 1500 laser pulses were used to grow the film. The introduction of oxygen at the conclusion of the run occurred with the heated substrate stage temperature maintained at 700° C. The heated stage was then cooled at controlled rate, reaching 200° C. after 90 minutes. At this point, the supply of heat to the substrate stage was discontinued, and the substrate was allowed to cool.

The thin film had a shiny black appearance. XRD analysis revealed it to a highly oriented $Y_1Ba_2Cu_3$ orthorhombic perovskite crystal structure with the unit cell c-axis normal to the substrate surface. Superconductivity ($T_o$) was observed at 86° C.

The significant difference between the procedure of Example 1 resulting in a cubic perovskite crystal structure and the procedure described above resulting in an orthorhombic perovskite crystal structure was that in Example 1 the temperature of the heated stage (and therefore the substrate) was maintained at 560° C. during deposition, whereas in the procedure described above the temperature of the heated stage during deposition was 700° C.

During further investigations the following relationships between the heating stage temperature during deposition and the observed thin film crystal structure were observed:

TABLE I

| Heat Stage (°C.) | Thin Film Crystal Form |
|---|---|
| 525 | Amorphous |
| 550 | Cubic Perovskite |
| 625 | Cubic Perovskite |
| 650 | Orthorhombic Perovskite |

At temperatures in the range of 525° to 550° C. a mixture of amorphous and cubic perovskite phases were observed. At temperatures in the range of 625° to 650° C. indications of a mixture of cubic and orthorhombic perovskite phases were observed.

EXAMPLE 4

Thermal Stability of Cubic Perovskite Thin Films

A cubic perovskite thin film similar to that of Example 1 was heated to 700° C. and then examined by TEM analysis. No evidence of conversion to an orthorhombic perovskite crystal structure was observed.

When a procedure analogous to that described above was repeated, but with heating to 800° C. being undertaken and XRD analysis being employed, no evidence was found of the cubic perovskite crystal structure being converted to an orthorhombic perovskite crystal structure.

EXAMPLE 5

Layer Arrangement for Josephson Junction Structure

This example demonstrates the formation of a three layer sequence of the type required for the formation of a Josephson junction structure.

Except as otherwise indicated the procedure of Example 1 was followed. The oxygen pressure during deposition was 200 mTorr, and the laser pulse energy was 350 mJ. A first layer was formed using a 700° C. heated stage and 800 laser pulses, giving a first layer thickness of about 800 Å. This layer exhibited an orthorhombic perovskite $Y_1Ba_2Cu_3$ unit cell crystal structure similar to that described in Example 3. The second layer was a cubic perovskite crystal structure having a thickness of about 200 Å. The second layer was similar to the thin film produced in Example 1. The third layer was formed similarly to the first layer with similar results.

XRD analysis of the resulting three layer thin film suggested the presence of both the orthorhombic and cubic perovskite phases. Ion channelling measurements using 3.45 Mev He ions indicated a high degree of crystalline perfection throughout the film. Minimum backscattering yields of 73 percent at the surface and 45 percent near the interface with the substrate were found, indicating a higher degree of crystal perfection nearer the substrate interface and an epitaxial relationship of layers throughout the film.

EXAMPLE 6

Superlattice Structure

This example demonstrates the formation of a superlattice structure.

Except as otherwise indicated the procedure of Example 1 was followed. A multilayer structure was built of alternating layers of the orthorhombic perovskite crystal structure and the cubic perovskite crystal structure. The orthorhombic perovskite crystal structure was formed using a heated substrate stage temperature of 700°, and the cubic perovskite crystal structure was formed using a heated substrate stage temperature of 560° C. The deposition sequence was begun with an orthorhombic perovskite layer being formed by 300 laser pulses. The substrate temperature was then lowered, and a second, cubic perovskite crystal structure layer formed by 150 laser pulses. The heating stage temperature was then raised to 700° C. to form a third, orthorhombic perovskite crystal structure layer using 150 laser pulses. By varying the temperature between 560° C. and 700° C. and using 25, 50 or 100 laser pulses, 10 more layers were formed. Finally, a final, cubic perovskite crystal structure was formed using 800 laser pulses. Each pulse was found to yield nearly 1Å of layer thickness. XRD analysis revealed the presence of both orthorhombic and cubic perovskite crystals structures in the multilayer film. Ion channeling studies showed that the epitaxial relationship was maintained through the entire structure. In similarly prepared superlattices TEM analysis showed abrupt boundaries between orthorhombic perovskite and cubic perovskite layers.

The invention has been described in detail with particular reference to preferred embodiments thereof, but it will be understood that variations and modifications can be effected within the spirit and scope of the invention.

What is claimed is:

1. An article comprised of
a monocrystalline substrate capable of supporting the epitaxial deposition of a superconductive $R_1A_2C_3$ orthorhombic perovskite crystal phase and
a layer comprised of a cubic perovskite crystal structure satisfying the unit cell formula:

$$R_{0.33+z}A_{0.67}C_{1-y}O_{3-x}$$

wherein

A is at least 50 percent barium on an atomic basis with any additional alkaline earths being chosen from the group consisting of strontium and calcium.

C is copper,

R is ytterium or a lanthanide other than cerium, praseodymium, promethium and terbium, x is 0.67 to 1;

y is up to 0.2; and z is up to 0.1.

2. An article according to claim 1 wherein R consists essentially of yttrium.

3. An article according to claim 1 wherein z is up to 0.08.

4. An article according to claim 1 wherein A is at least 80 percent barium on an atomic basis.

5. An article according to claim 4 wherein any additional alkaline earth is strontium.

6. An article according to claim 1 wherein y is from 0.05 to 0.18.

7. An article according to claim 1 wherein x is from 0.67 to 0.85.

8. An article according to claim 1 in which the cubic perovskite crystal structure satisfies the unit cell formula:

$$Y_{0.33+z}Ba_{0.67}Cu_{1-y}O_{3-x}$$

where x represents 0.67 to 0.85;

y represents 0.05 to 0.18; and z is up to 0.08.

9. An article according to claim 1 in which a layer comprised of an $R_1A_2C_3$ orthorhombic perovskite crystal phase overlies said cubic perovskite crystal structure containing layer, where in the $R_1A_2C_3$ phase A is at least 50 percent barium on an atomic basis with any additional alkaline earths being chosen from the group consisting of strontium and calcium, C is copper, and R is ytterium or a lanthanide other than cerium, praseodymium, promethium and terbium.

10. An article according to claim 9 in which said overlying layer is superconductive.

11. An article according to claim 1 in which a first layer comprised of an $R_1A_2C_3$ orthorhombic perovskite crystal phase is interposed between said substrate and said cubic perovskite crystal structure containing layer, where in the $R_1A_2C_3$ phase A is at least 50 percent barium on an atomic basis with any additional alkaline earths being chosen from the group consisting of strontium and calcium, C is copper, and R is ytterium or a lanthanide other than cerium, praseodymium, promethium and terbium.

12. An article according to claim 11 in which said first layer is superconductive $R_1A_2C_3$.

13. An article according to claim 11 in which a second layer comprised of an $R_1A_2C_3$ orthorhombic perovskite crystal phase overlies said cubic perovskite crystal structure containing layer, where in the $R_1A_2C_3$ phase in the second layer A is at least 50 percent barium on an atomic basis with any additional alkaline earths being chosen from the group consisting of strontium and calcium, C is copper, and R is ytterium or a lanthanide other than cerium, praseodymium, promethium and terbium.

14. An article according to claim 13 in which said second layer is superconductive.

15. An article according to claim 1 in which the substrate is magnesia, alumina or a perovskite.

16. An article according to claim 15 in which the perovskite is chosen from the group consisting of strontium titanate, lanthanum aluminate, lanthanum: gallium oxide and potassium tantalate.

* * * * *